(12) United States Patent
Caldwell

(10) Patent No.: US 6,944,018 B2
(45) Date of Patent: Sep. 13, 2005

(54) CONTROL SYSTEM INPUT APPARATUS AND METHOD

(75) Inventor: David W. Caldwell, Holland, MI (US)

(73) Assignee: Touchsensor Technologies, LLC, Wheaton, IL (US)

( * ) Notice: Subject to any disclaimer, the term of this patent is extended or adjusted under 35 U.S.C. 154(b) by 0 days.

(21) Appl. No.: 10/141,289

(22) Filed: May 6, 2002

(65) Prior Publication Data

US 2003/0075427 A1 Apr. 24, 2003

Related U.S. Application Data

(60) Provisional application No. 60/289,225, filed on May 7, 2001.

(51) Int. Cl.[7] .................................................. G06F 1/16
(52) U.S. Cl. ........................ 361/686; 361/680; 361/683; 200/600
(58) Field of Search .................................. 361/680, 683, 361/686, 687, 724–727; 341/26, 33, 34; 345/174, 179, 173; 307/98, 99, 109, 116; 178/17 C, 17 D, 18; 200/5 A, 600; 400/479.1

(56) References Cited

U.S. PATENT DOCUMENTS

| | | | | |
|---|---|---|---|---|
| 4,090,092 A | | 5/1978 | Serrano ...................... 307/116 |
| 4,121,204 A | | 10/1978 | Welch et al. ................ 340/337 |
| 4,495,485 A | * | 1/1985 | Smith ...................... 340/365 C |
| 4,561,002 A | * | 12/1985 | Chiu ............................ 341/26 |
| 5,017,030 A | * | 5/1991 | Crews ......................... 400/485 |
| 5,220,521 A | * | 6/1993 | Kikinis .................. 364/709.08 |
| 5,239,152 A | | 8/1993 | Caldwell et al. ............ 200/600 |
| 5,341,036 A | * | 8/1994 | Wheeler et al. ............. 307/328 |
| 5,594,222 A | * | 1/1997 | Caldwell ..................... 200/600 |
| 5,760,715 A | * | 6/1998 | Senk et al. .................... 341/33 |
| 5,917,165 A | | 6/1999 | Platt et al. .................. 200/600 |
| 6,034,335 A | | 3/2000 | Aufderheide et al. .......... 200/5 |
| 6,478,285 B1 | * | 11/2002 | Bergmann ............. 251/129.03 |

FOREIGN PATENT DOCUMENTS

| | | | | |
|---|---|---|---|---|
| EP | 54306 A | * | 6/1982 | .......... H03K/17/96 |
| EP | 0603039 | | 6/1994 | |
| EP | WO000008487 A1 | * | 8/1998 | .......... H03K/17/96 |
| EP | 0858166 | | 8/1998 | |
| EP | WO01/11776 | * | 2/2001 | .......... H03K/17/96 |
| FR | 2374811 | | 7/1978 | |
| FR | 2704332 | | 10/1994 | |
| FR | 2739233 | | 3/1997 | |
| GB | 1464094 | * | 2/1977 | |
| GB | 2 156 993 A | * | 10/1985 | .......... H03K/17/96 |
| WO | 9016045 | | 12/1990 | |

* cited by examiner

Primary Examiner—Michael Datskovskiy
(74) Attorney, Agent, or Firm—Jenner & Block LLP

(57) ABSTRACT

A control system interface integrates an electronic switching or sensing mechanism with an existing or custom-fabricated, functional or decorative equipment panel. The electronic switching or sensing mechanism is located on the rear surface of the equipment panel and a corresponding touch surface is defined on the front surface of the equipment panel. The electronic switching or sensing mechanism is responsive to a stimulus in the proximity of the touch surface, and it provides a control signal to a control system when it senses such a stimulus.

6 Claims, 3 Drawing Sheets

US 6,944,018 B2

CONTROL SYSTEM INPUT APPARATUS AND METHOD

CROSS-REFERENCE TO RELATED APPLICATIONS

This application claims priority from U.S. Provisional Patent Application Ser. No. 60/289,225 filed on May 7, 2001.

BACKGROUND OF THE INVENTION

1. Technical Field

The present invention relates generally to control system input apparatus and methods for making same. More particularly, the present invention relates to integration of electronic touch switches or sensors with shaped panels, such as decorative fascia and the like.

2. The Prior Art

Conventional electrical control panels typically comprise one or more mechanical or membrane switches installed on flat, or planar, panels having substantially uniform thickness and/or cross section. One known type of control panel includes one or more mechanical switches mounted on a flat panel having one or more apertures for accommodating the one or more mechanical switches. Such control panels are commonly used in connection with a wide variety of equipment, including industrial machines, automobile dashboards, and all sorts of consumer products. Another known type of control panel includes one or more membrane switches mounted on a substantially flat substrate and covered with a thin, flexible plastic overlay. The overlay helps to protect the underlying switches and circuitry from spills and moisture. The overlay also may incorporate a decorative design, such as a mimic of the switch layout mimic, thereon. Such control panels commonly are used in connection with exercise equipment (such as rowing machines and treadmills), gas pumps, and all sorts of other apparatus.

Certain disadvantages are inherent in the foregoing types of control panels. For example, the apertures inherent to mechanical switch panels provide a path for fluids and contaminants to enter the rear portion of the control panel, increasing the potential for short circuits and damage to components within the panel. Further, the mechanical switches themselves typically are assemblies of several individual parts which are subject to moisture or fluid intrusion. As such, mechanical switch panels are less than ideal for use in harsh environments, unless peripheral protective enclosures are provided. Such enclosures are costly, unsightly, and make the switch panel inconvenient to use.

Switch panels using membrane switches offer some protection to the elements by way of the flexible overlay. However, such overlays typically do not provide a complete barrier to moisture and fluids. Also, they are prone to damage resulting from ordinary use and cleaning. Further, they can become embrittled with age, particularly if used in harsh environments. The overlays can develop cracks, leading to failure of the moisture barrier.

Mechanical switches generally are substantially rigid devices best suited for mounting on a flat surface or substrate. Although the contact mechanism in a membrane switch is inherently somewhat flexible, the overall switch package is substantially rigid and best suited for mounting on a flat surface or substrate. Neither mechanical nor membrane switches are particularly well-suited for use with any panel shape other than flat. Though attempts have been made to use such conventional switches in connection with shaped panels, such as curved panels, such attempts typically have not yielded elegant solutions. It would be desirable to provide a switch panel having a free-form design whose contours are not limited to planar surfaces.

SUMMARY OF THE INVENTION

The present invention provides a novel control system input apparatus and a method for making same by integrating electronic touch switches and/or sensors (these terms are used interchangeably herein) with panels, such as decorative and/or functional fascia, having planar, curved, or complex surfaces. In a preferred embodiment, one or more touch switches are mated with the rear surface of a functional and/or decorative panel of an apparatus receiving control systems inputs from such touch switches. A corresponding touch surface is defined on the front surface of the panel opposite each such touch switch. In order to actuate one of the touch switches, a user simply introduces a stimulus, such as a finger or hand, in the proximity of the corresponding touch surface.

A control system input apparatus, or control panel, according to the present invention can take nearly any form. For example, it can have any number of convex or concave surfaces, or it can be a substantially planar panel having raised portions and/or depressions, i.e., a non-uniform cross-section or thickness, for enabling a user to more easily locate a particular touch switch. The present invention is well-suited for providing control panels for use with controlled apparatus exercise equipment and for integrating control panels into the decorative fascia of products such as vending machines and beverage dispensers of the type commonly found in fast food outlets, movie theaters, and the like.

A control panel according to the present invention preferably incorporates touch switches or sensors embodying technology covered by U.S. Pat. No. 5,594,222, U.S. Pat. No. 6,310,611 and/or U.S. Pat. No. 6,320,682, the disclosures of which are hereby incorporated by reference. Such touch switches are available from TouchSensor Technologies of Wheaton, Ill. A touch switch according to the foregoing references can be fabricated on a wide variety of substrates. For example, such a touch switch can be fabricated on a flexible sheet, as well as on a rigid substrate.

DETAILED DESCRIPTION OF THE PREFERRED EMBODIMENT

Figure 1:
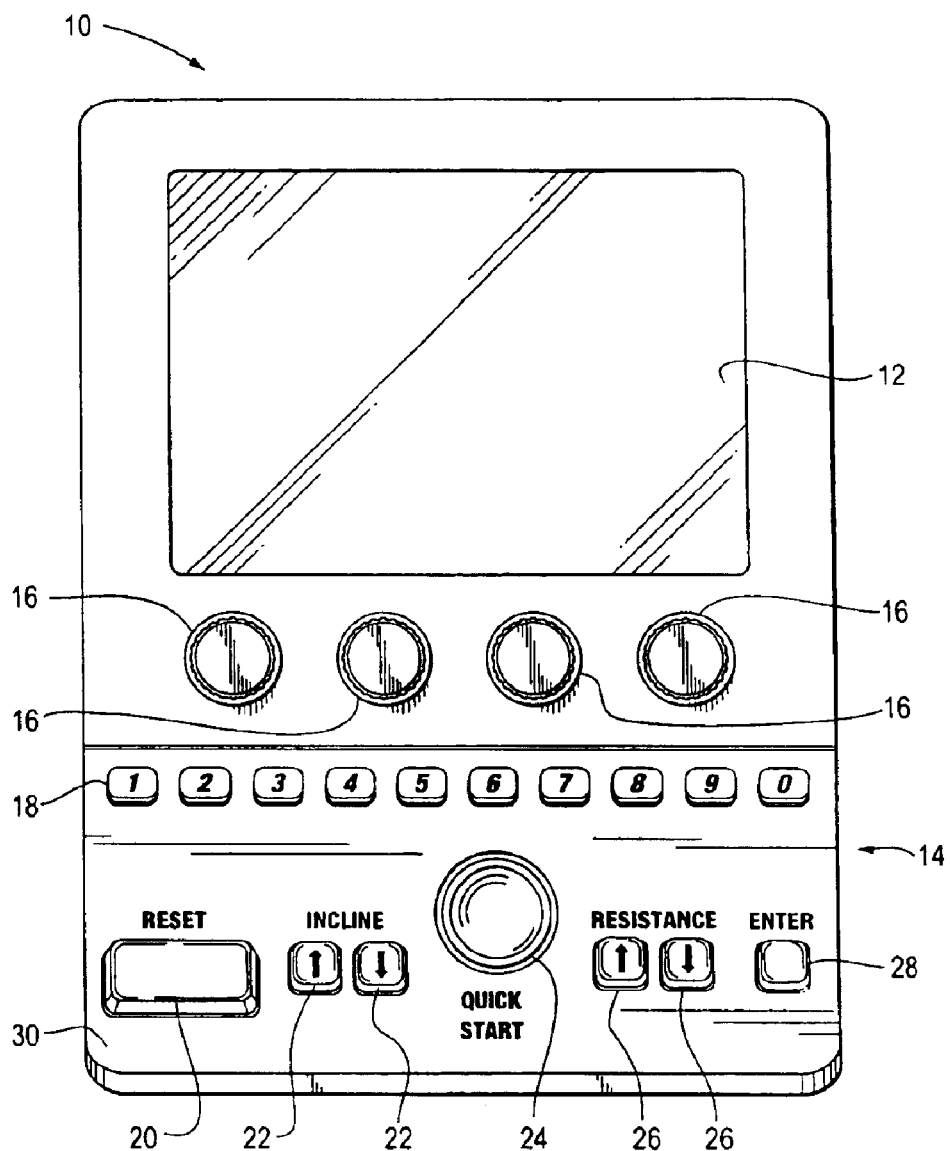
FIG. 1 is a plan view of a user interface for a piece of exercise equipment embodying the present invention.

FIG. 1 illustrates a user interface 10 of a piece of exercise equipment, namely, a treadmill (not shown), embodying the present invention. User interface 10 includes a display 12 and a control panel 14. Control panel 14 is a substrate including a plurality of touch surfaces, such as display control touch surfaces 16 which control various functions of display 12, touch surfaces 18 for numerical input, touch surface 20 for resetting the treadmill's controls, touch surfaces 22 for adjusting the inclination of the treadmill's running surface, touch surface 24 for starting the treadmill, touch surfaces 26 for adjusting the treadmill's resistance, and touch surface 28 for indicating that data is to be entered to the treadmill's control system.

Control panel 14, as shown in FIG. 1, is generally planar. In other embodiments, control panel 14 can take any desired curved or angular shape. For example, control panel 14 can include convex, concave, and or angular elements.

The front surface 30 of control panel 14 generally conforms to the contour of control panel 14. That is, in the FIG. 1 embodiment, control panel 14 is generally planar and front surface 30 thereof also is generally planar. Touch surfaces 18 are generally co-planar with front surface 30. However, portions of control panel 14, namely, touch surfaces 16, 20, 22, 26, and 28 are recessed from front surface 30. Another portion of control panel 14, namely, touch surface 24, is raised above front surface 30. These features, which are more easily seen with reference to FIGS. 2 and 3, make it easier for a user to locate a particular touch surface through tactile means, in addition to or instead of visual means. Further, the switches or sensors (discussed further below) associated with raised touch surfaces, such as touch surface 24, are less likely to be adversely affected by contaminants (especially liquid contaminants) because it is difficult, if not impossible, for contaminants to pool or settle about a raised surface.

Figure 2:
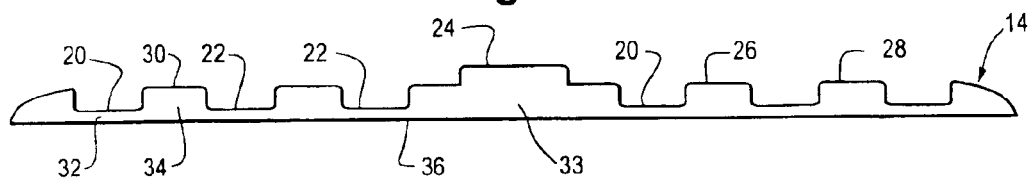
FIG. 2 is a cross-sectional elevation view of an equipment panel according to a preferred embodiment of the present invention.
Figure 3:
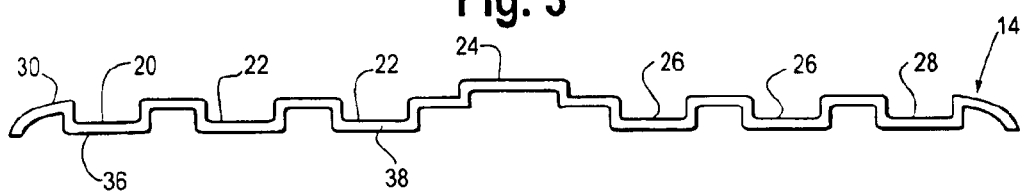
FIG. 3 is a cross-sectional elevation view of an equipment panel according to another preferred embodiment of the present invention.

The raised and recessed portions of front surface 30 can be achieved in various ways. For example, FIG. 2 shows an embodiment wherein control panel 14 has multiple thicknesses. In this embodiment, control panel 14 generally has a first thickness 34 between front surface 30 and rear surface 36 (which is generally planar). Control panel 14 also has a second, reduced thickness 32 in the regions corresponding to, for example, touch surfaces 20, 22, 26, and 28. Control panel 14 further has a third, greater thickness 33 in the region corresponding to touch surface 24. FIG. 3 shows an alternate embodiment wherein control panel 14 has a substantially uniform thickness 38, and wherein rear surface 36 generally conforms to front surface 30. Other embodiments can use any combination of the foregoing techniques or any other suitable technique.

Figure 4:
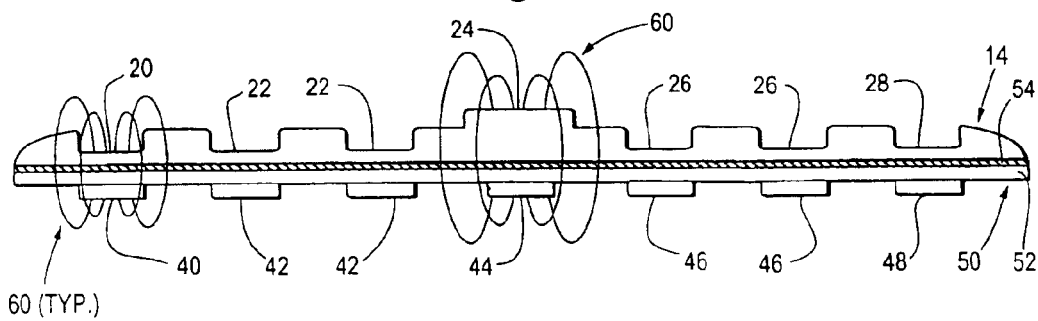
FIG. 4 is a cross-sectional elevation view of an electronic switch panel integrated with an equipment panel according to a preferred embodiment of the present invention.

FIG. 4 illustrates a sensor panel 50 attached to the control panel 14 embodiment illustrated in FIG. 2. Sensor panel 50 includes touch switches 40, 42, 44, 46, and 48 formed onto substrate 52. Each touch switch 40, 42, 44, 46, and 48 is connected to a control system, control interface or control logic (not shown). Substrate 52 is generally planar and generally conforms to rear surface 36 of control panel 14. In alternate embodiments, substrate 52 can be convex, concave, or take other shapes so as to be substantially conformable to rear surface 36. Substrate 52 is positioned relative to control panel 14 so that touch switches 40, 42, 44, 46, and 48 are aligned with corresponding touch surfaces 20, 22, 24, 26, and 28. In the FIG. 4 embodiment, properly aligned substrate 52 is bonded to rear surface 36 of control panel 14 using an appropriate adhesive. In other embodiments, substrate 52 can be connected to rear surface 36 of control panel 14 by any other suitable means, such as mechanical fasteners. However, it is preferred that the attachment mechanism does not require perforation of control panel 14.

Figure 5:
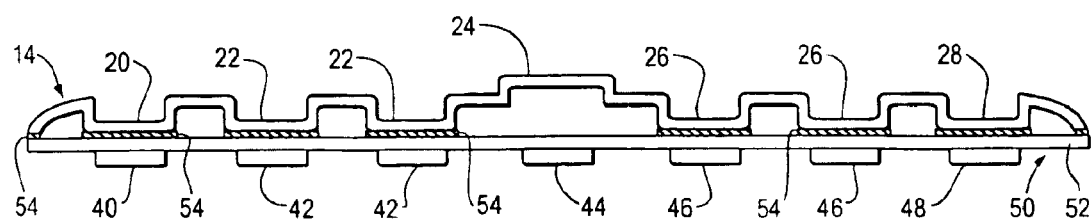
FIG. 5 is a cross-sectional elevation view of an electronic switch panel integrated with an equipment panel according to another preferred embodiment of the present invention.

FIG. 5 illustrates sensor panel 50 attached to the control panel 14 embodiment illustrated in FIG. 3. In this embodiment, substrate 52 generally conforms to the portions of rear surface 36 adjacent touch surfaces 20, 22, 26, and 28, i.e., the "high points" of rear surface 36. As in the FIG. 4 embodiment, substrate 52 is positioned relative to control panel 14 so that touch switches 40, 42, 44, 46, and 48 are aligned with corresponding touch surfaces 20, 22, 24, 26, and 28. Properly aligned substrate 52 preferably is bonded to rear surface 36 of control panel 14 using an appropriate adhesive. In other embodiments, substrate 52 can be connected to rear surface 36 of control panel 14 by any other suitable means, such as mechanical fasteners. However, it is preferred that the attachment mechanism does not require perforation of control panel 14.

Figure 6:
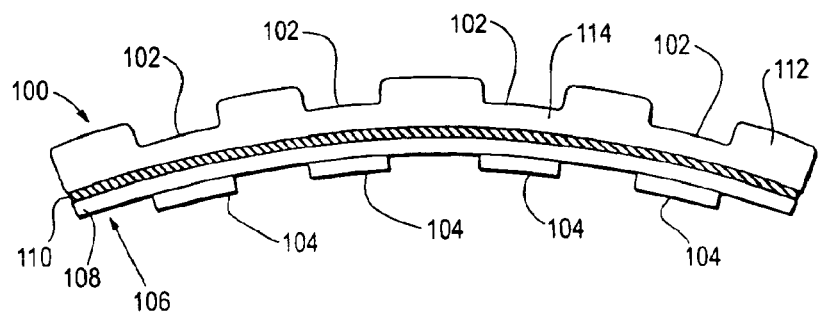
FIG. 6 is a cross-sectional elevation view of electronic switch panel integrated with an equipment panel according to a further preferred embodiment of the present invention.

FIG. 6 shows a cross-sectional view of a curved control panel 100 embodying the present invention. Control panel 100 includes a number of touch surfaces 102. A switch panel 106 including a number of touch switches 104 on a substrate 108 is bonded to control panel 100 using a suitable adhesive 110. Control panel 100 generally has a first thickness 112, and it has a second, reduced thickness 114 in the regions adjacent touch surfaces 102. Alternatively, one or more regions of control panel 100 corresponding to one or more raised touch surfaces (not shown) could have increased thickness (not shown).

In operation, each touch switch, for example, touch switch 40, sets up an electric field 60 in the proximity thereof. The introduction of a stimulus, for example, a user's finger (not shown), in the proximity of the electric field causes touch switch 40 to functionally change state and provide a corresponding input to an associated control system, control interface or control logic (not shown). This phenomenon is discussed more thoroughly in the foregoing U.S. patents incorporated herein by reference.

For example, if a user desired to start the treadmill whose control panel is shown in FIG. 1, the user would touch or bring his/her finger close to touch surface 24. This action would disturb the electric field set up by corresponding touch switch 44. In response, touch switch 44 would provide an output signal to the treadmill's control logic (not shown), which in turn would cause the treadmill to start.

The present invention allows integration of an electrical switching mechanism into an existing or custom-fabricated, functional and/or decorative panel, without the need to perforate the panel, as would be the case if conventional mechanical and/or membrane switches were to be used. For example, the decorative front panel of a vending machine or beverage dispenser (not shown) can be adapted for use as a control panel simply by defining touch surfaces at any desired location on the front of the decorative panel and providing associated touch switches at corresponding locations on the rear of the decorative panel, as described above. This allows for a novel and elegant solution to the problem of providing aesthetic and ergonomic control system input devices for all sorts of equipment.

The present invention thus has been described in terms of certain preferred embodiments. These embodiments are not to be construed as limiting the present invention, whose scope is defined by the claims appended hereto.

What is claimed is:

1. A control system interface, comprising:
    a panel having a front surface and a rear surface;
    a plurality of touch switches associated with said rear surface of said panel; and
    a plurality of touch surfaces associated with said front surface of said panel, each of said plurality of touch surfaces corresponding to a different one of said plurality of touch switches;

wherein each of said touch switches is responsive to the presence of a stimulus proximate the corresponding touch surface; and wherein the thickness of said substrate between a first touch switch and corresponding touch surface varies substantially from the thickness of said substrate between a second touch switch and corresponding touch surface.

2. The apparatus of claim 1 wherein said plurality of touch switches is disposed on said rear surface of said panel.

3. The apparatus of claim 1 wherein said plurality of touch switches is disposed on a substrate and said substrate is attached to said panel.

4. A control system interface, comprising:

a panel having a front surface and a rear surface;

a plurality of touch switches associated with said rear surface of said panel; and a plurality of touch surfaces associated with said front surface of said panel, each of said plurality of touch surfaces corresponding to a different one of said plurality of touch switches;

wherein each of said touch switches is responsive to the presence of a stimulus proximate the corresponding touch surface; and wherein said panel is curved such that a line perpendicular to said panel at a first touch surface is not parallel to a line perpendicular to said panel at a second touch surface.

5. The apparatus of claim 4 wherein said plurality of touch switches is disposed on said rear surface of said panel.

6. The apparatus of claim 4 wherein said plurality of touch switches is disposed on a substrate and said substrate is attached to said panel.

* * * * *